(12) United States Patent
Stanley

(10) Patent No.: US 8,743,533 B2
(45) Date of Patent: Jun. 3, 2014

(54) LOCKING MEMBER FOR JOINING PORTIONS OF AN ASSEMBLY

(75) Inventor: Craig M. Stanley, Campbell, CA (US)

(73) Assignee: Apple Inc., Cupertino, CA (US)

( * ) Notice: Subject to any disclaimer, the term of this patent is extended or adjusted under 35 U.S.C. 154(b) by 350 days.

(21) Appl. No.: 13/216,898

(22) Filed: Aug. 24, 2011

(65) Prior Publication Data
US 2013/0050909 A1 Feb. 28, 2013

(51) Int. Cl.
*H05K 5/00* (2006.01)
*H05K 7/00* (2006.01)
*H04R 25/00* (2006.01)
*H05K 5/02* (2006.01)
*G06F 1/16* (2006.01)
*H01R 13/633* (2006.01)
*H01R 13/629* (2006.01)
*E05B 73/00* (2006.01)

(52) U.S. Cl.
CPC *H05K 5/023* (2013.01); *G06F 1/16* (2013.01); *H01R 13/6335* (2013.01); *H01R 13/62905* (2013.01); *E05B 73/0082* (2013.01)
USPC ...... 361/679.01; 381/370; 381/374; 381/375; 381/384

(58) Field of Classification Search
CPC G06F 1/16; H01R 13/6335; H01R 13/62905; E05B 73/0082; H05K 5/00; H05K 5/023; H05K 7/00
USPC ........ 61/679.01, 679.02; 361/679.01, 679.02; 381/370, 374, 375, 384
See application file for complete search history.

(56) References Cited

U.S. PATENT DOCUMENTS

| | | | |
|---|---|---|---|
| 5,973,284 A | 10/1999 | Takenaka et al. | |
| 6,495,783 B2 * | 12/2002 | Rochon et al. | 200/406 |
| 6,999,321 B2 | 2/2006 | Suekawa et al. | |
| 7,892,010 B2 | 2/2011 | Lux | |
| 7,989,696 B2 | 8/2011 | Shi et al. | |
| 8,456,864 B2 * | 6/2013 | Stiehl et al. | 361/832 |
| 2008/0166003 A1 * | 7/2008 | Hankey et al. | 381/370 |
| 2011/0194710 A1 | 8/2011 | Prest et al. | |

* cited by examiner

*Primary Examiner* — Anthony Haughton
(74) *Attorney, Agent, or Firm* — Womble Carlyle Sandridge & Rice LLP

(57) ABSTRACT

Electronic device assemblies may have multiple parts. A first electronic device assembly structure may be attached to a second electronic device assembly structure using a locking member. The locking member may include a tip portion that is inserted into a guiding channel in the assembly and a disposable portion that breaks away from the tip portion during assembly. Barbs on the locking member tip may resist retraction of the tip following assembly. A cam locking structure may help hold the first and second structures together. Locking features may resist longitudinal motion between the first and second structures. Snap features may provide a fail-safe mechanism to prevent disassembly of the assembly following an accidental dislodgement of the tip portion. The tip portion and assembly structures may be configured to resist bowing in the assembly structures.

20 Claims, 15 Drawing Sheets

LOCKING MEMBER FOR JOINING PORTIONS OF AN ASSEMBLY

BACKGROUND

This relates generally to forming assemblies and, more particularly, to forming assemblies of structures for accessories and other electronic devices.

Electronic devices such as headphones and other accessories are often formed from small plastic parts. With conventional techniques, parts may be joined using snaps, adhesive, or screws. The use of snap features may require over-travel between parts (i.e., parts may be required to pass a "click point" in which one part passes over another to engage the snap). A biasing structure may then be required to ensure that the parts do not rattle. The biasing structures may flex, which may allow the parts to experience an undesirable movement with respect to one another following assembly. Glue can be used to attach parts, but can be challenging to dispense and may produce inconsistent results. Screws are often too large for use with compact assemblies.

In view of these challenges, it would be desirable to be able to provide improved techniques for joining structures when forming assemblies such as assemblies for electronic devices.

SUMMARY

Electronic device assemblies may have multiple parts. For example, a button assembly may have a first portion such as a housing structure and a second portion such as a body structure containing one or more switches.

A first electronic device assembly structure may be attached to a second electronic device assembly structure using a locking member. The locking member may be, for example, a metal or plastic staple-shaped locking device.

The locking member may include a tip portion that is inserted into a guiding channel in the assembly. The guiding channel may have a taper that facilitates insertion of the locking member and may have portions that resist retraction of the locking member following insertion.

The locking member may have a disposable portion that breaks away from the tip portion during the delivery process. Barbs on the locking member tip and adhesive in the guiding channel may resist retraction of the tip following delivery.

A cam locking structure may help hold the first and second structures together. The cam locking structure may be formed by enlarging an end portion of one of the assembly structures so that the end portion has a thickness that is greater than the thickness of a mating recess.

Locking features may resist longitudinal motion between the first and second structures. Snap features may provide a fail safe mechanism to prevent disassembly of the assembly structures following accidental dislodgement of the tip portion within the interior of the assembly. The tip portion and assembly structures may be configured to resist bowing in the assembly structures such as outward bowing in housing wall structures.

Further features of the invention, its nature and various advantages will be more apparent from the accompanying drawings and the following detailed description of the preferred embodiments.

DETAILED DESCRIPTION

Figure 1:
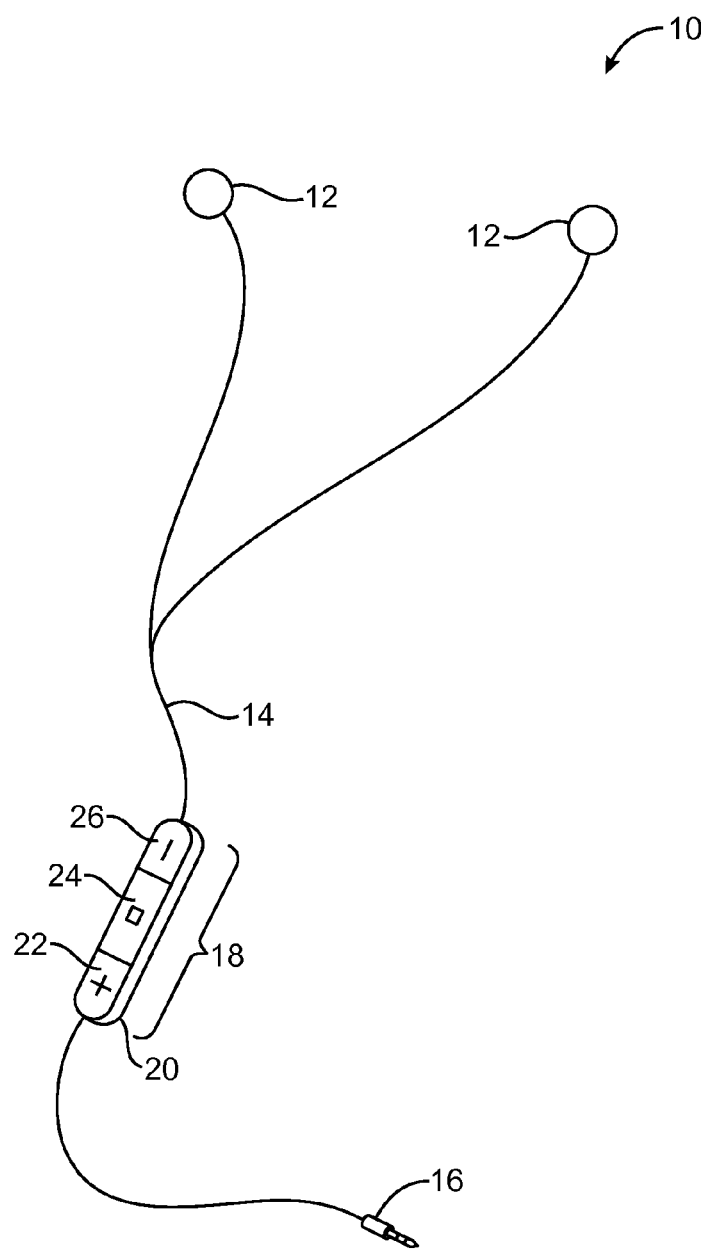
FIG. 1 is a perspective view of an illustrative electronic device assembly that has been formed using locking member structures such as a staple-shaped locking structure in accordance with an embodiment of the present invention.

Accessories such as electronic device 10 of FIG. 1 may be formed from multiple parts. In the example of FIG. 1, device 10 is a headset having speakers 12 that are coupled to audio jack 16 by wires 14. Electronic device 10 of FIG. 1 is merely illustrative. In general, device 10 may be any suitable equipment such as a computer, media player, cellular telephone, game player, headset, accessory, etc. The example of FIG. 1 is merely illustrative.

Devices such as device 10 of FIG. 1 and other equipment may include structures that are formed from multiple parts. Such structures are sometimes referred to as assemblies. The parts that form the assemblies are sometimes referred to as components, structures, members, etc.

In the FIG. 1 example, device 10 includes button assembly 18. Assembly 18 may have button structures such as button structures 22, 24, and 26 mounted in a housing such as housing 20. Other types of devices may be formed partly or completely using different types of assemblies. Assembly 18 of FIG. 1 is merely illustrative.

Figure 2:
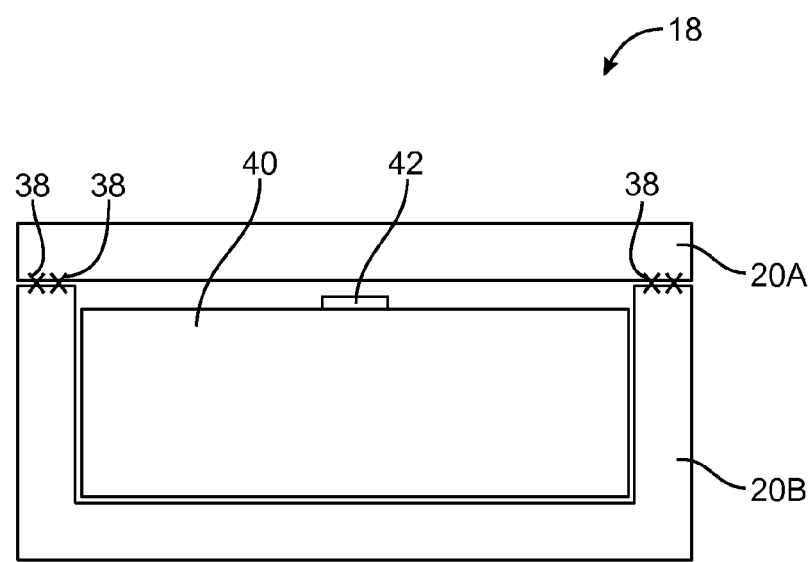
FIG. 2 is a cross-sectional end view of an illustrative assembly in accordance with an embodiment of the present invention.

A cross-sectional end view of assembly 18 is shown in FIG. 2. As shown in FIG. 2, assembly 18 may have a housing portion such as housing 12B and a button cover structure (e.g., a flexible structure for forming buttons 22, 24, and 26) such as cover 20A. Cover 20A may be attached to housing structure 20B using attachment mechanisms 38 (e.g., adhesive, welds, screws or other fasteners, snaps or other engagement features, or other suitable attachment mechanisms).

An internal structure such as body structure containing one or more switches 40 may be mounted within housing portion 20B. Body structure 40 may include switch mechanisms (e.g., three switch mechanisms each of which corresponds to a respective one of three buttons 22, 24, and 26). During operation, switch structures such as illustrative switch structure 42 may be actuated by pressing on an appropriate portion of structure 20A. Housing structures such as structure 20B may be formed from plastic (e.g., a rigid plastic). Housing structure 20A may be formed from flexible plastic. Body structure 40 may be formed from plastic or other suitable materials and may include circuit board structures, components such as switches, conductive traces, and other circuits and structures for forming a button assembly or other structures for device 10.

Figure 3:
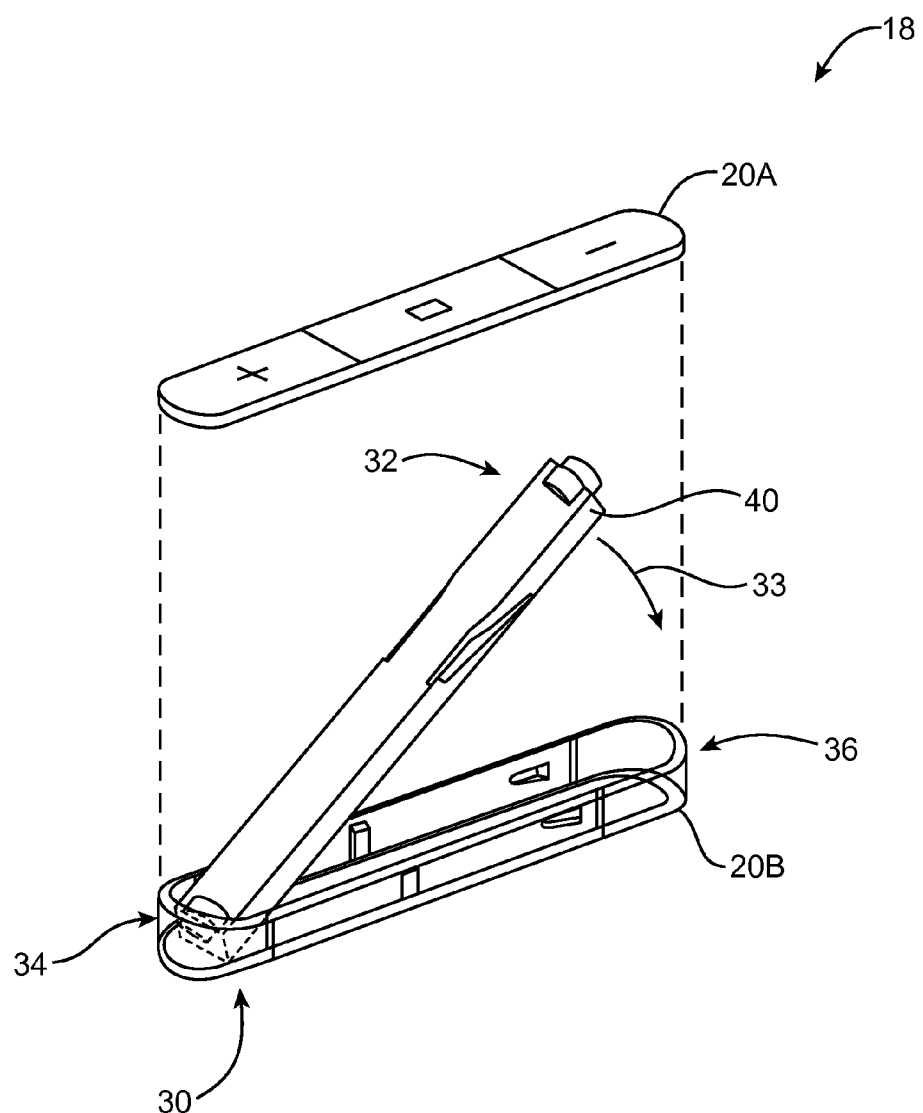
FIG. 3 is an exploded perspective view of an illustrative assembly showing how structures within the assembly may be assembled in accordance with an embodiment of the present invention.

An exploded perspective view of assembly 18 of FIG. 1 is shown in FIG. 3. As shown in FIG. 3, assembly 18 may be formed by inserting end 30 of body structure 40 into end 34 of housing structure 20B. Following insertion of end 30 into the recess formed at the end 34 of housing structure 20B, end 32 of body structure 40 may be rotated in direction 33 until end 32 of body structure 40 has been fully inserted into end 36 of housing structure 20B. Structure 20A may then be attached to the top of housing 20B.

Figure 4:
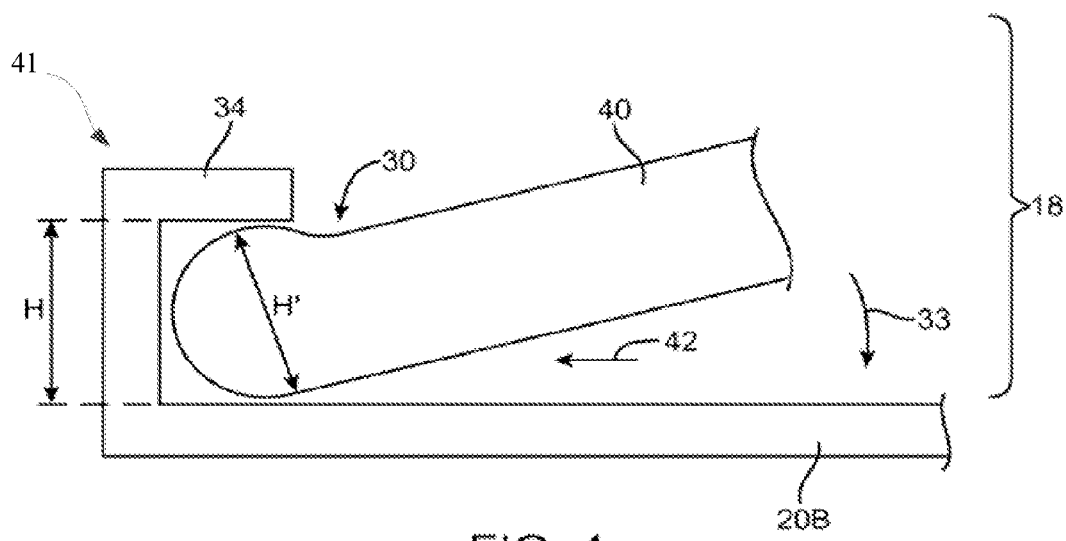
FIG. 4 is a cross-sectional side view of an illustrative assembly showing how a cam locking feature may be used in securing parts together in accordance with an embodiment of the present invention.
Figure 5:
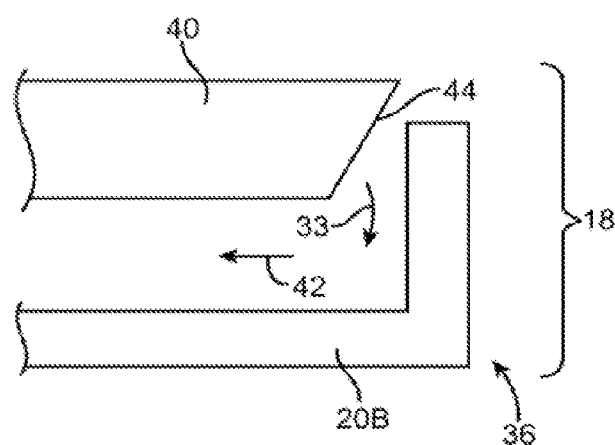
FIG. 5 is cross-sectional side view of an illustrative assembly showing how a beveled end shape may be used to help bias a member with a cam locking feature of the type shown in FIG. 4 into a recess in another member in accordance with an embodiment of the present invention.

It may be desirable to use a cam locking mechanism to hold parts of an assembly together. As an example, a first part of an assembly such as body structure 40 of assembly 18 and a second part of an assembly such as housing structures 20B may be configured to form a cam locking mechanism 41 that is activated by rotating the first part relative to the second part. Consider, as an example, the illustrative configuration of FIG. 4. As shown in FIG. 4, end 30 of body structure structure 40 may be provided with an enlarged thickness H' that is larger than the thickness H of a mating recess in end portion 34 of housing structures 20B. When structure 40 is rotated in direction 32, end 30 will form a friction fit with the inner surfaces of end portion 34 of housing structure 20B. A longitudinal biasing structure such as angled surface 44 on the end of structure 40 near end 36 of housing structure 20B may be used to help bias structure 40 in direction 42 into end 34, as shown in FIG. 5. Other biasing mechanisms may be used if desired (e.g., foam, springs, etc.).

Figure 6:
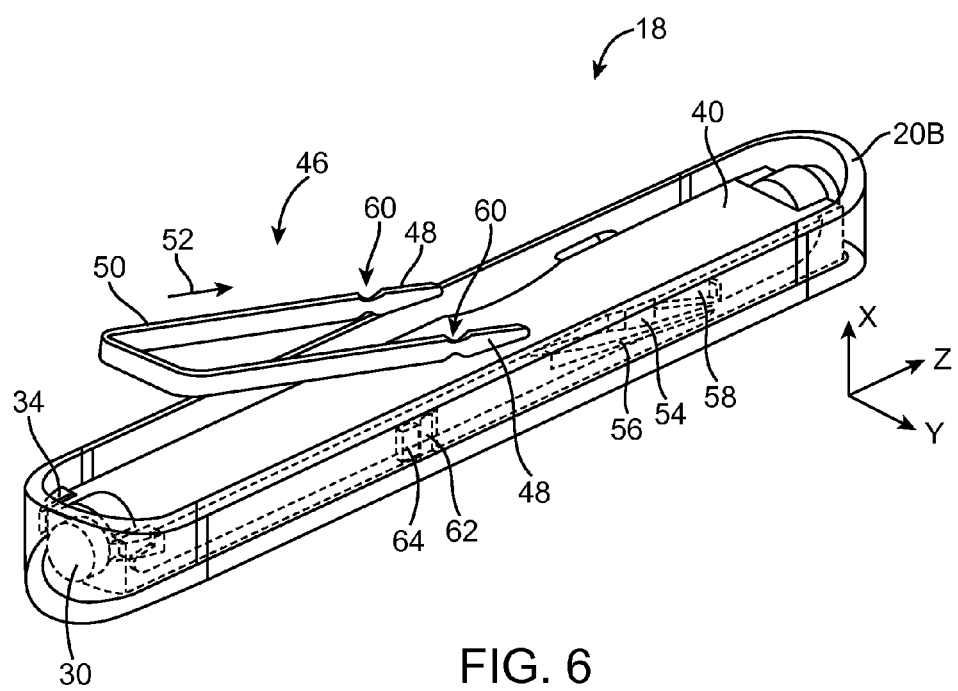
FIG. 6 is a perspective view showing how a staple-shaped locking device may be inserted into a mating feature in an assembly in accordance with an embodiment of the present invention.

Locking members such as staple-shaped locking devices may be used to help hold parts of an assembly together. The locking members may be formed from metal, plastic, or other suitable materials. FIG. 6 is a perspective view of assembly 18 showing how a break-away locking member such as breakaway staple-shaped locking device 46 (e.g., a metal staple-shaped locking device) may be used to help mount body structure 40 within housing structure 20B. As shown in FIG. 6, housing structure 20B may have staple-shaped locking device (locking member) guiding structures such as guiding ramp structures 56. Body structure 40 may have staple-shaped locking device (locking member) guiding structures such as guiding ramp structures 58. Structures 56 and 58 may be configured to form a staple-shaped locking device guiding feature (e.g., a recess such as a channel that receives tips 48 of staple-shaped locking device 46). Structures 56 and 58 may, for example, form an opening such as staple-shaped locking device guiding opening (guiding channel) 54.

Staple-shaped locking device 46 may have tip portions such as staple-shaped locking device tips 48 that are inserted into assembly 18 during the assembly process. Staple-shaped locking device 46 may also have breakaway portions such as structures 50 (i.e., a disposable staple-shaped locking device portion). Following insertion of tips 48 into staple-shaped locking device guiding opening 54 in direction 52, portion 50 may be flexed up and down. This flexing motion may cause tips 48 to break away from portion 50 at weakened (narrowed) portions 60 of staple-shaped locking device 46 (sometimes referred to as stress concentrator notches). Portion 50, which serves as a disposable staple-shaped locking device tip delivery structure, may then be discarded. Tips 48 may help secure structures 40 and 20B to form assembly 18.

Figure 7:
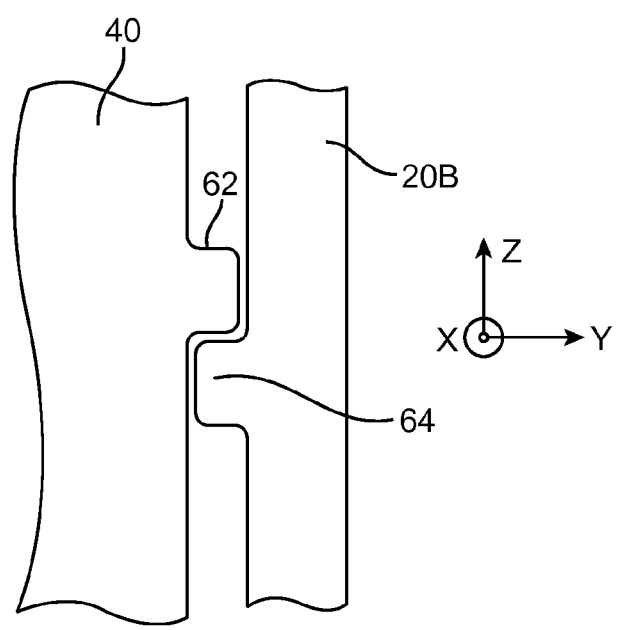
FIG. 7 is a top view showing how the structures within an assembly of the type shown in FIG. 6 may be provided with longitudinal motion locking features in accordance with an embodiment of the present invention.

Structures 20B and 40 may have interlocking features that help resist longitudinal motion between structures 20B and 40. For example, structure 40 may have a longitudinal motion locking structure such as protrusion 62 and structure 20B may have a longitudinal motion locking structure such as mating protrusion 64. As shown in the top view of FIG. 7, locking structures 62 and 64 may engage one another to help prevent relative motion of structures 40 and 20B along longitudinal axis Z following assembly of structures 40 into structures 20B.

Figure 8:
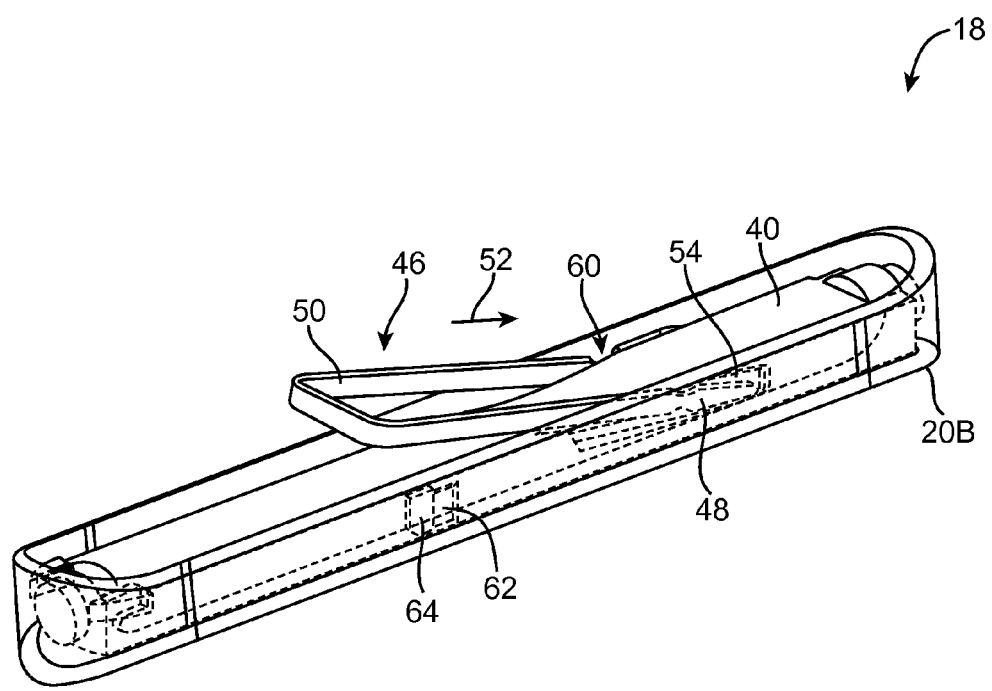
FIG. 8 is a perspective view of the assembly of FIG. 6 following insertion of a tip portion of the staple-shaped locking device in accordance with an embodiment of the present invention.
Figure 9:
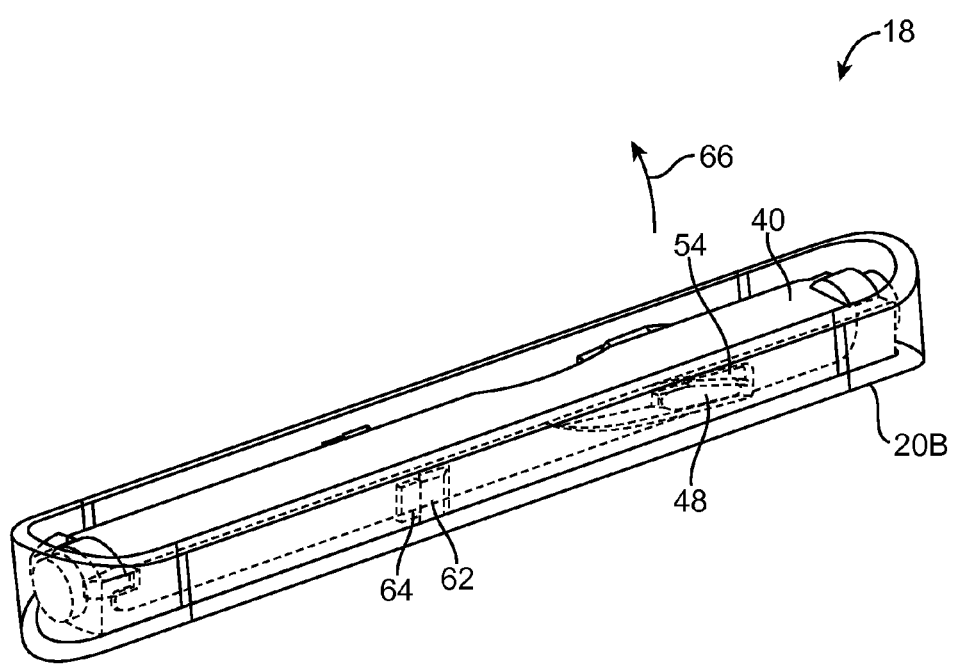
FIG. 9 is a perspective view of an illustrative assembly of the type shown in FIG. 8 following an operation to break away a portion of the staple-shaped locking device in accordance with an embodiment of the present invention.

FIG. 8 shows the position of staple-shaped locking device tips 48 after portion 50 of staple-shaped locking device 46 has been used to drive staple-shaped locking device tips 48 into staple-shaped locking device guiding opening 54 in direction 52. Following flexing of portion 50 relative to tips 48, narrowed portions 60 of staple-shaped locking device 46 will break, thereby detaching portion 50 from tips 48 of staple-shaped locking device 46. Assembly 18 will therefore have the appearance shown in FIG. 9, in which staple-shaped locking device tips 48 have become lodged within opening 54.

When sufficient force is used to drive staple-shaped locking device tips 48 into assembly 18, the presence of tips 48 will tend to force the sidewall portions of opening 54 away from each other. This biasing force, in turn, creates friction between structures 40 and 20B and staple-shaped locking device tips 48 that helps to retain staple-shaped locking device tips 48 in assembly 18 and helps hold structures 40 within structures 20B. Structures 40 are also held within structure 20B because staple-shaped locking device tips 48 block structures 40 and prevent structures 40 from being rotated upwards in direction 66.

Figure 10:
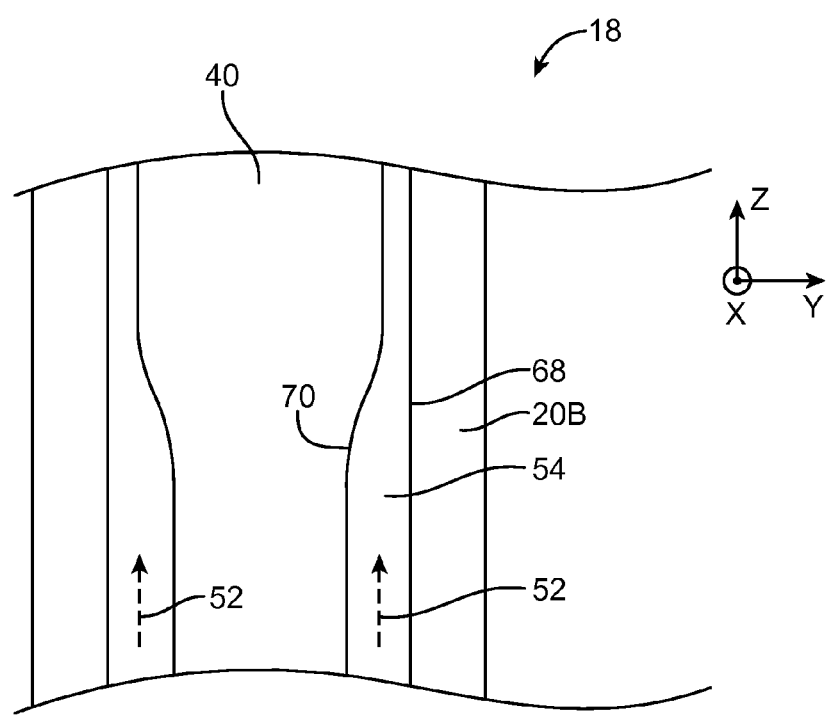
FIG. 10 is a top view showing how the parts that make up the assembly of FIG. 9 may be provided with tapered sidewalls to help guide a tip portion of the staple-shaped locking device in accordance with an embodiment of the present invention.

As shown in the top view of FIG. 10, structure 40 may have an outer surface 70 and structure 20B may have an opposing inner surface 68 that are configured to form a tapered shape for staple-shaped locking device guiding opening 54. This tapered shape may help to guide staple-shaped locking device tips 48 into position as staple-shaped locking device 46 is driven into assembly 18 in direction 52 during assembly.

Figure 11:
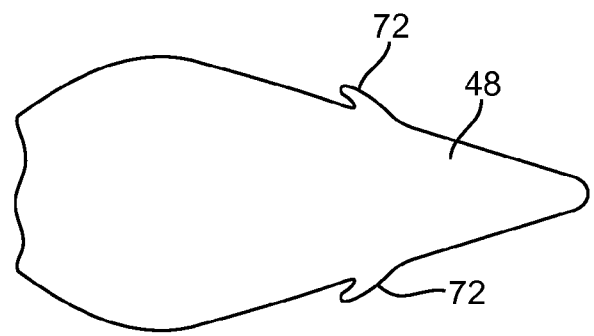
FIG. 11 is a diagram of an illustrative staple-shaped locking device tip portion showing how the staple-shaped locking device may be provided with a barb feature to resist retraction of the staple-shaped locking device in accordance with an embodiment of the present invention.
Figure 12:
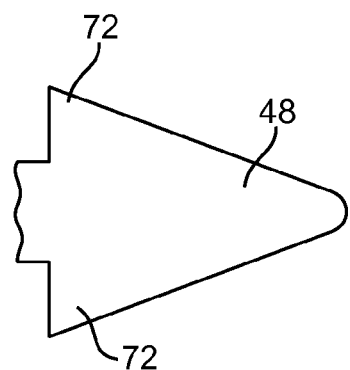
FIG. 12 is a diagram of another illustrative barbed staple-shaped locking device tip configuration that may be used to resist retraction of the staple-shaped locking device in accordance with an embodiment of the present invention.

FIGS. 11 and 12 show how staple-shaped locking device tips 48 may be provided with retention features such as barbs 72 to help resist retraction following assembly. The illustrative staple-shaped locking device tip shapes of FIGS. 11 and 12 are merely illustrative. Staple-shaped locking device tips 48 may have any suitable profile with barbs of any suitable shape.

Figure 13:
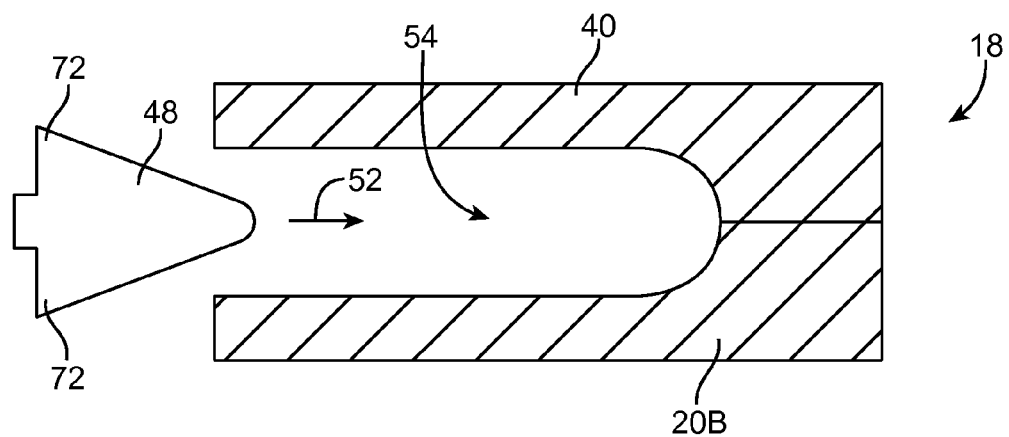
FIG. 13 is a side view of a portion of an assembly before insertion of a barbed staple-shaped locking device of the type shown in FIG. 12 in accordance with an embodiment of the present invention.

FIG. 13 is a side view of a portion of assembly 18 before insertion of a barbed staple-shaped locking device of the type shown in FIG. 12 into opening 54 of assembly 18 in direction 52.

Figure 14:
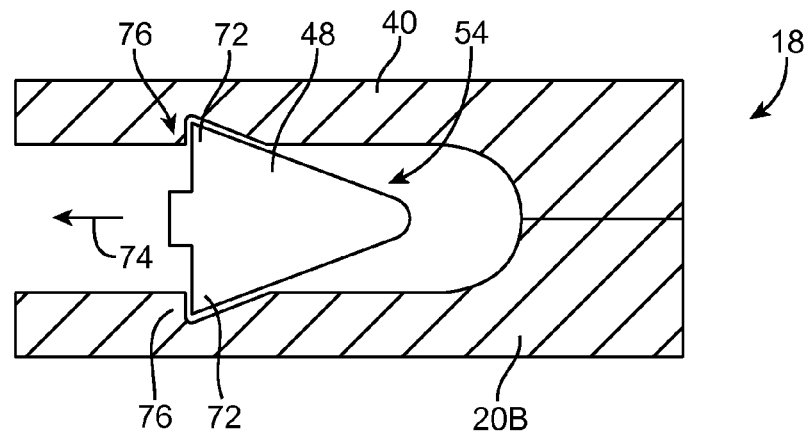
FIG. 14 is a side view of a portion of an assembly after insertion of a barbed staple-shaped locking device of the type shown in FIG. 12 in accordance with an embodiment of the present invention.

FIG. 14 is a side view of assembly 18 of FIG. 13 after insertion of barbed staple-shaped locking device 48 of FIG. 13. As shown in FIG. 14, the structures of assembly 18 such as structures 40 and structures 20B may deform so that portions 76 engage barbs 72 and resist retraction of staple-shaped locking device tip 48 in direction 74.

Figure 15:
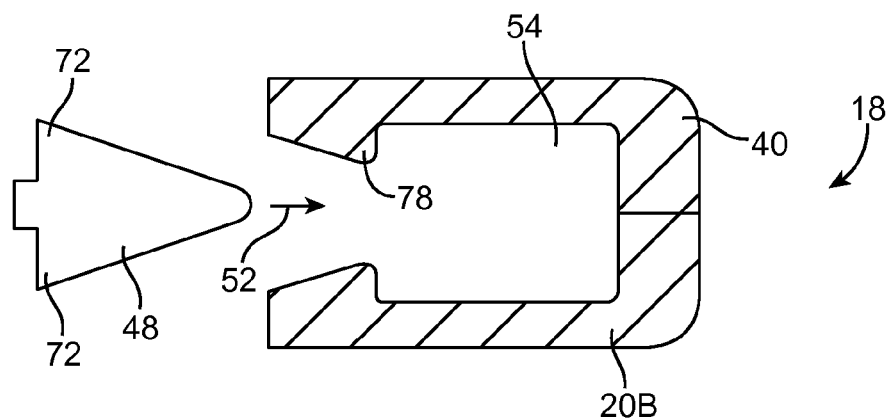
FIG. 15 is a side view of a portion of an assembly before insertion of a barbed staple-shaped locking device of the type shown in FIG. 11 in accordance with an embodiment of the present invention.

FIG. 15 is a side view of a portion of assembly 18 before insertion of a barbed staple-shaped locking device of the type shown in FIG. 11 into opening 54 of assembly 18 in direction 52.

Figure 16:
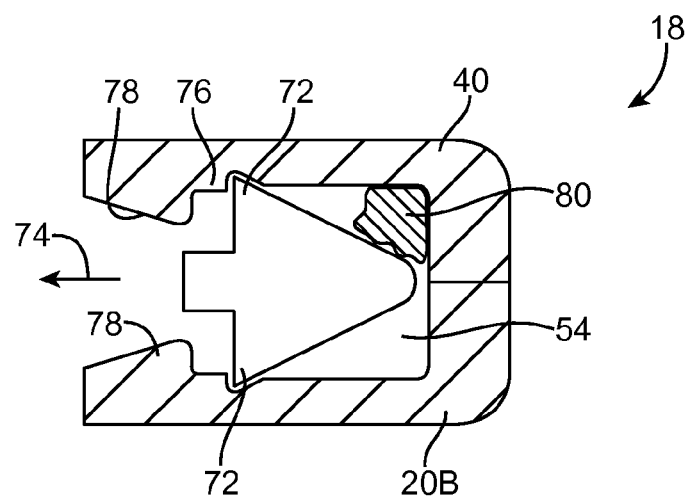
FIG. 16 is a side view of a portion of an assembly after insertion of a barbed staple-shaped locking device of the type shown in FIG. 11 in accordance with an embodiment of the present invention.

FIG. 16 is a side view of assembly 18 of FIG. 15 after insertion of barbed staple-shaped locking device 48 of FIG. 15. As shown in FIG. 16, the structures of assembly 18 such as structures 40 and structures 20B may deform so that portions 76 engage barbs 72 and resist retraction of staple-shaped locking device tip 48 in direction 74. If desired, the structures of assembly 18 such as structures 40 and 20B may be provided with additional staple-shaped locking device retention features such as ramped protrusions 78, which further help prevent retraction of staple-shaped locking device tip 48 in direction 74. Optional adhesive 80 may be inserted into opening 54 prior to assembly to help provide additional retention for staple-shaped locking device tip 48.

Figure 17:
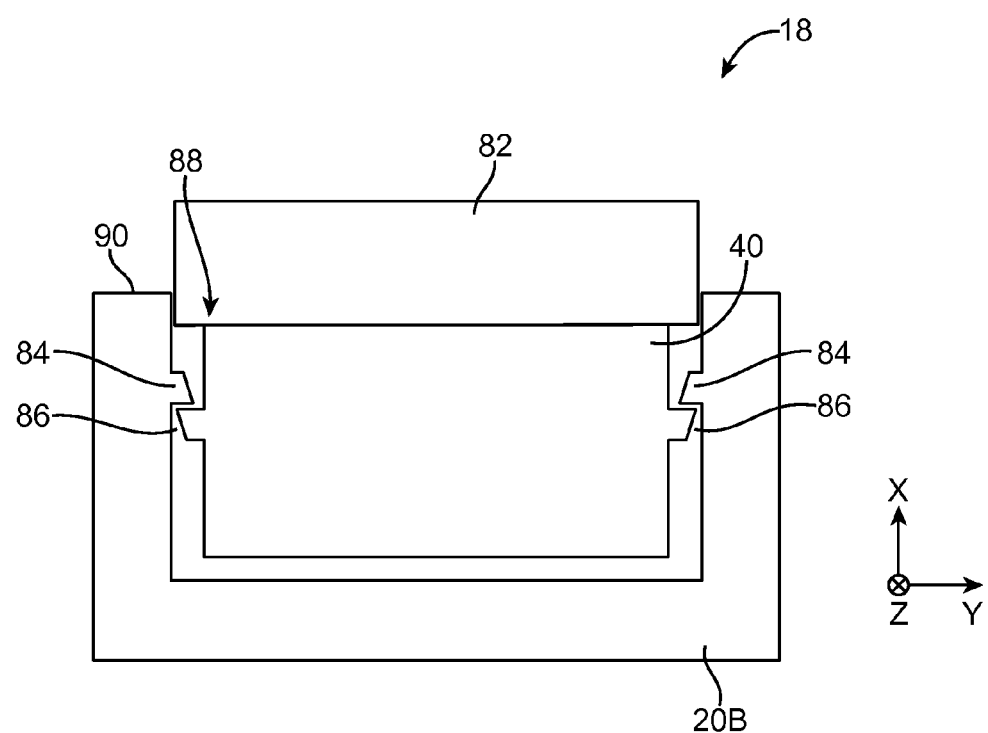
FIG. 17 is a cross-sectional end view of an illustrative assembly showing how the assembly may be provided with retention features to help hold portions of the assembly together even in the event of failure of a staple-shaped locking device connection in accordance with an embodiment of the present invention.

FIG. 17 is a cross-sectional end view of an illustrative configuration that may be used for assembly 18 showing how assembly 18 may be provided with engagement features such as snap features that serve as a fail safe mechanism to prevent disassembly of assembly 18 after staple-shaped locking device tip 48 has been inserted into assembly 18 and broken off from the rest of staple-shaped locking device 46. The snap features may help hold assembly 18 together and prevent staple-shaped locking device tip 48 from exiting the interior of assembly 18 in the event that staple-shaped locking device tip 48 becomes dislodged within the interior of assembly 18. As shown in FIG. 17, movement of structures 40 in vertical direction X relative to structures 20B can be impeded by incorporating interlocking features (snaps) such as protrusions 84 and 86 on structures 40 and 20B. Protrusions 84 and 86 may be implemented using guiding ramp structure 58 and 56, respectively (see, e.g., FIGS. 6 and 18). Button structures 82 may be attached to structures 40. As shown in FIG. 17, the engagement features formed from structures 84 and 86 may be configured so that interface layer 88 between structures 82 and structures 40 does not extend above upper edge 90 of housing wall structures 20B in the event that the staple-shaped locking device tip becomes dislodged within assembly 18, so that button structures 82 will help retain the staple-shaped locking device tip within the interior of assembly 18.

Figure 18:
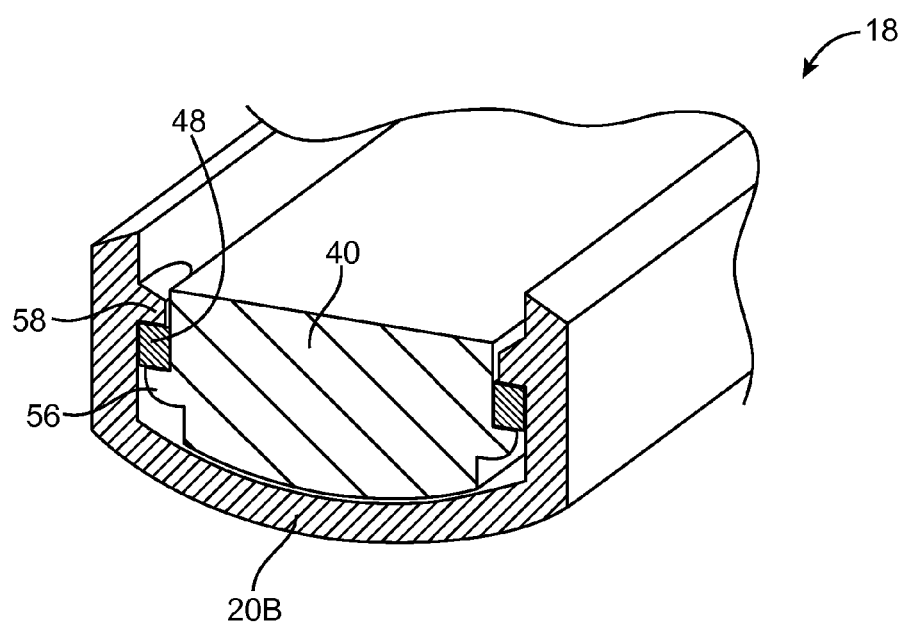
FIG. 18 is a cross-sectional perspective view showing how a staple-shaped locking device may be captured within a recess that is formed from multiple parts of an assembly in accordance with an embodiment of the present invention.

FIG. 18 is a cross-sectional end view of assembly 18 showing how staple-shaped locking device tip 48 may be inserted into a guiding opening formed by structures 58 on housing portion 20B and opposing structures on an internal member such as opposing structures 56 on body structure 40.

Figure 19:
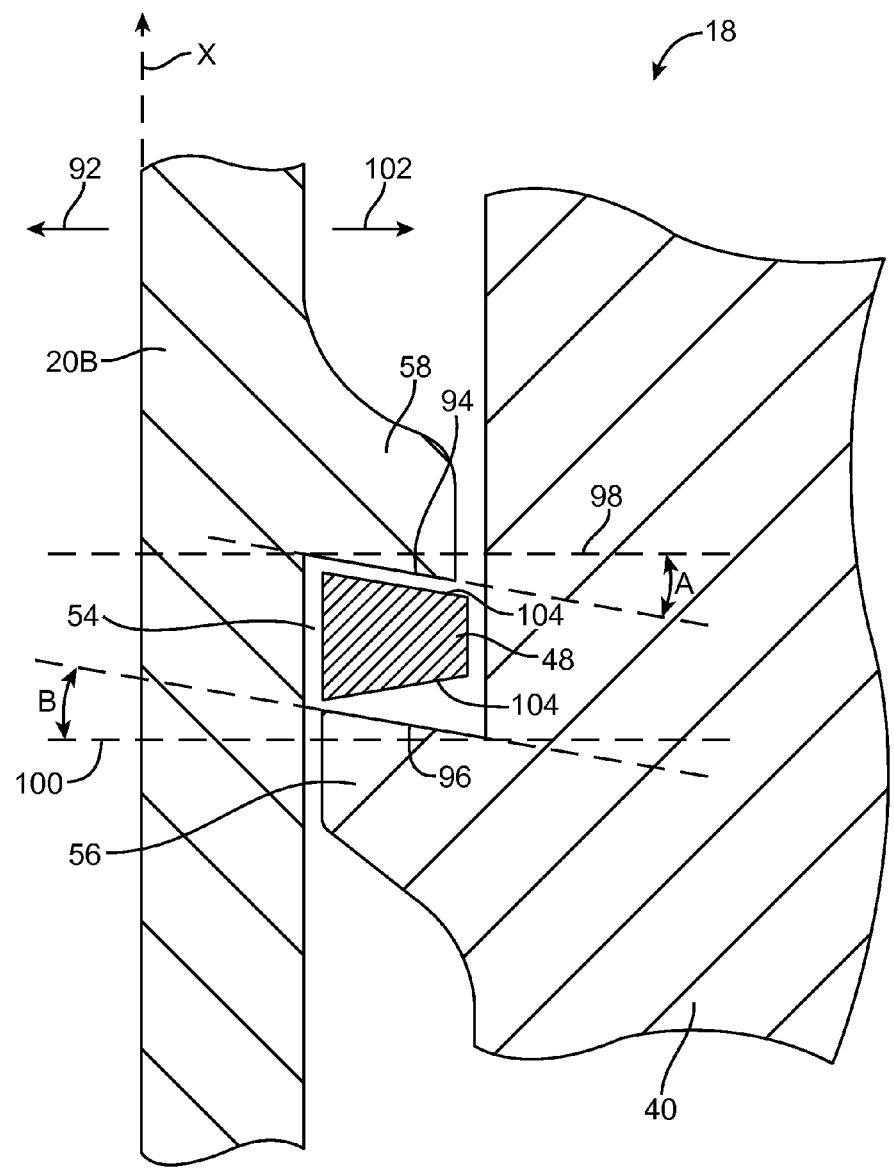
FIG. 19 is a cross-sectional end view of a portion of the assembly of FIG. 18 showing how the structures that form the recess may be configured to resist bowing in accordance with an embodiment of the present invention.

Structures 58 and 56 may have angled horizontal surfaces that help prevent bowing in housing 20B. As shown in FIG. 19, for example, portion 58 may have a lower surface such as surface 94 that is oriented at a non-zero angle A with respect to horizontal axis 98, so that surface 94 tilts inwardly towards the interior of assembly 18. Portion 56 of structure 40 may have an opposing upper surface such as surface 96 that is oriented at a non-zero angle B with respect to horizontal axis 100, so that surface 96 tilts inwardly towards the interior of assembly 18. When staple shaped locking device tip 48 is inserted into assembly 18, opposing forces will be generated between structures 58 and 56. The presence of the tilted surfaces of structures 56 and 58 may help pull housing wall 20B inwardly in direction 102, thereby resisting bowing movement outwardly in direction 92. If desired, the anti-bowing tilted surface structures associated with guiding opening 54 may be formed by providing staple-shaped locking device tip 48 with tilted surfaces at non-zero angles as shown in FIG. 19 in addition to or instead of providing protruding portions 56 and 58 with tilted surfaces. The tilted surfaces on tip 48 may form a cross-sectional wedge shape for tip 48 that helps to prevent outward bowing in housing wall 20B.

The foregoing is merely illustrative of the principles of this invention and various modifications can be made by those skilled in the art without departing from the scope and spirit of the invention.

What is claimed is:

1. An electronic device assembly, comprising:
   a housing structure, comprising:
      a plurality of sidewalls and a bottom wall defining a cavity, and
      a first recess formed along an interior surface of a selected one the plurality of sidewalls;
   a body structure disposed within the cavity, the body structure comprising a second recess formed along an outside surface of the body structure, the second recess disposed proximate the first recess;
   a guiding channel cooperatively formed by the first recess and the second recess; and
   a locking member tip lodged within the guiding channel, the locking member tip operative to secure the housing structure to the body structure.

2. The electronic device assembly as recited in claim 1, wherein the housing structure further comprises a first protrusion, and wherein the body structure further comprises a second protrusion, the first and second protrusions cooperating to prevent longitudinal movement of the body structure within the cavity of the housing structure.

3. The electronic device assembly as recited in claim 1, further comprising a button structure coupled to a top surface of the body structure, the button structure configured to receive a user input.

4. The electronic device assembly as recited in claim 3, wherein the button structure comprises a plurality of switches.

5. The electronic device assembly as recited in claim 1, wherein the locking member tip is lodged within the guiding channel by a staple-shaped locking device.

6. The electronic device assembly as recited in claim 1, wherein the locking member tip comprises at least one barb, the at least one barb configured to prevent the locking member tip from being dislodged from the guiding channel.

7. The electronic device assembly as recited in claim 1, further comprising:
   a third recess disposed along another sidewall of the plurality of sidewalls, the other sidewall being positioned opposite the sidewall that includes the first recess; and
   a fourth recess disposed along the body structure, the fourth recess disposed proximate the third recess, wherein the third recess and fourth recess cooperatively form another guiding channel; and
   another locking member tip lodged within the other guiding channel.

8. The electronic device assembly as recited in claim 1, wherein the housing structure has a recessed portion, wherein the body structure has an end portion that is received within the recessed portion, and wherein the recessed portion and the end portion form a cam locking structure that holds the body structure within the housing structure.

9. The electronic device assembly as recited in claim 1 wherein the housing structure and the body structure extend along a common longitudinal axis and wherein the housing and body structures comprise longitudinal motion locking features that resist relative motion between the housing and body structures along the longitudinal axis.

10. The electronic device assembly as recited in claim 1 wherein the first and second recesses comprise opposing portions that form the guiding channel for the locking member and wherein the opposing portions form snap features that prevent disassembly of the housing and body structures in response to dislodgement of the locking member.

11. The electronic device assembly as recited in claim 10, wherein the housing structure comprises a sidewall with an upper edge, wherein the body structure includes a module and a structure attached to the module at an interface, and wherein the snap features are configured to prevent the interface from extending above the upper edge in response to dislodgement of the locking member.

12. The electronic device assembly as recited in claim 1 wherein the first and second recesses comprise tilted portions that receive the locking mechanism and that are configured to reduce outward bowing in the selected sidewall.

13. The electronic device assembly as recited in claim 1 wherein the locking member has a cross-sectional wedge shape to reduce outward bowing in the wall.

14. The electronic device assembly as recited in claim 1 wherein the first and second recesses have portions that form a tapered opening for receiving the locking member.

15. The electronic device assembly as recited in claim 11, wherein the first and second recesses have protrusions in the guiding channel that are configured to prevent retraction of the locking member from the guiding channel.

16. An assembly, comprising:
   a housing structure comprising a plurality of walls that cooperate to form a cavity, wherein a first recess is disposed along an interior surface of a select one of the plurality of walls;
   an internal structure disposed within the cavity, the internal structure comprising a second recess disposed along an outside surface of the internal structure, wherein the first recess and the second recess cooperate to form a guiding channel; and
   a locking member disposed within the guiding channel, the locking member cooperating with the guiding channel opening to restrict horizontal and vertical movement of the internal structure within the housing structure.

17. The assembly as recited in claim 16, wherein the locking member is a tip portion of a staple-shaped locking device positioned within the guiding channel by the staple-shaped locking device, a narrowed stress concentrator region disposed along the length of the staple-shaped locking device and configured to facilitate breakage of the tip portion of the staple-shaped locking device from other portions of the staple-shaped locking device.

18. A button assembly, comprising:
   a housing comprising a housing wall that defines at least a portion of a cavity, wherein an interior surface of the housing wall defines a first recess;
   a body structure disposed within the cavity that contains at least one switch, an outside surface of the body structure comprising a second recess, wherein the first recess and the second recess cooperate to form a guiding channel; and
   a locking device tip that is inserted into the guiding channel, the guiding channel oriented in a direction different than a longitudinal axis of the body structure.

19. The button assembly as recited in claim 18, wherein the locking device tip comprises barbs.

20. The button assembly as recited in claim 19, wherein the locking device tip is inserted within the guiding channel by a disposable staple-shaped locking device.

* * * * *

UNITED STATES PATENT AND TRADEMARK OFFICE
CERTIFICATE OF CORRECTION

Page 1 of 1

PATENT NO.         : 8,743,533 B2
APPLICATION NO.    : 13/216898
DATED              : June 3, 2014
INVENTOR(S)        : Craig M. Stanley It is certified that error appears in the above-identified patent and that said Letters Patent is hereby corrected as shown below:

In the Claims:

Column 7, lines 40 and 43 (Claim 10, lines 3 and 6): "locking member" should read --locking member tip--.

Column 7, line 50 (Claim 11, line 7): "locking member." should read --locking member tip.--.

Column 8, line 1 (Claim 12, line 3): "locking mechanism" should read --locking member tip--.

Column 8, line 4 (Claim 13, line 2): "locking member" should read --locking member tip--.

Column 8, line 8 (Claim 14, line 3): "locking member." should read --locking member tip.--.

Column 8, line 9 (Claim 15, line 1): "claim 11," should read --claim 1,--.

Column 8, line 12 (Claim 15, line 4): "locking member" should read --locking member tip--.

Column 8, line 25 (Claim 16, line 13): "opening to restrict" should read --to restrict--.

Signed and Sealed this
Thirteenth Day of January, 2015

Michelle K. Lee
*Deputy Director of the United States Patent and Trademark Office*